United States Patent
Blake

(10) Patent No.: US 6,188,811 B1
(45) Date of Patent: *Feb. 13, 2001

(54) FIBER OPTIC CURRENT SENSOR

(75) Inventor: James N. Blake, Scottsdale, AZ (US)

(73) Assignee: The Texas A&M Universtiy System, College Station, TX (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/183,977

(22) Filed: Oct. 31, 1998

(51) Int. Cl.$^7$ ................... G02B 6/00; G01J 4/00

(52) U.S. Cl. ................. 385/12; 385/11; 385/15; 385/25; 385/31; 385/42; 356/364; 356/365; 250/227.17; 250/227.18

(58) Field of Search ................... 385/11, 12, 15, 385/25, 31, 39, 42; 356/364, 365, 345, 351; 250/227.11, 227.14, 227.17, 227.18

(56) References Cited

U.S. PATENT DOCUMENTS

| | | | |
|---|---|---|---|
| 3,605,013 | * 9/1971 | Yoshikawa | 385/12 X |
| 3,707,321 | 12/1972 | Jaecklin et al. | 350/151 |
| 3,746,983 | * 7/1973 | Renz | 385/12 X |
| 4,255,018 | 3/1981 | Ulrich et al. | 385/12 X |
| 4,372,685 | 2/1983 | Ulrich | 356/350 |
| 4,456,376 | 6/1984 | Carrington et al. | 356/350 |
| 4,545,682 | 10/1985 | Greenwood | 356/350 |
| 4,578,639 | 3/1986 | Miller | 324/96 |
| 4,613,811 | 9/1986 | Vaerewyck et al. | 324/96 |
| 4,615,582 | 10/1986 | Lefevre et al. | 385/12 X |
| 4,733,938 | 3/1988 | Lefevre et al. | 385/12 X |
| 4,779,975 | 10/1988 | Kim | 356/345 |
| 4,894,608 | 1/1990 | Ulmer, Jr. | 324/96 |
| 4,947,107 | 8/1990 | Doerfler et al. | 324/96 |
| 4,973,899 | 11/1990 | Jones et al. | 324/96 |
| 5,034,679 | 7/1991 | Henderson et al. | 324/96 |
| 5,051,577 | 9/1991 | Lutz et al. | 250/227.17 |

(List continued on next page.)

FOREIGN PATENT DOCUMENTS

| | | | |
|---|---|---|---|
| 671 638 A5 | 9/1989 | (CH) | 385/12 X |
| 28 35 794 A1 | 2/1980 | (DE) | 385/12 X |
| 195 17 128 A1 | 11/1996 | (DE) | 385/12 X |
| 0612981 | 8/1994 | (EP) | 356/345 X |
| 2 190 744 | 11/1987 | (GB) | 385/123 X |

OTHER PUBLICATIONS

International Search Report for PCT/US 97/13656, dated Feb. 2, 1998.
International Search Report for PCT/US 98/12341, dated Oct. 21, 1998.
International Search Report for PCT/US 98/17233, dated Dec. 11, 1998.
International Search Report for PCT/US 98/20683, dated Feb. 24, 1999.
International Search Report for PCT/US 99/23945, dated Mar. 6, 2000.

(List continued on next page.)

Primary Examiner—Brian Healy
(74) Attorney, Agent, or Firm—Baker Botts L.L.P.

(57) ABSTRACT

A current sensor having an optmized optical fiber coil for sensing the magnetic field of a current of wire passing by or through the coil. The coil is optimally spun such that a particular ratio of the spin rate to the intrinsic polarization beat length is such for best maintenance of the circular polarization state of the light in the coil. The coil fiber may also be Terbium doped for greater sensitivity. The phase or birefringence modulation of the light may be piezoelectric or electro-optic. A Faraday rotator may be used in place of those modulators. The system may be open loop or closed loop. The feedback scheme may be via the modulator or the phase nulling current affecting the sensing coil.

43 Claims, 11 Drawing Sheets

U.S. PATENT DOCUMENTS

| | | |
|---|---|---|
| 5,056,885 | 10/1991 | Chinn .............................. 356/350 X |
| 5,063,290 | 11/1991 | Kersey ........................... 250/227.17 |
| 5,133,600 | 7/1992 | Schroder ............................. 356/350 |
| 5,157,461 | 10/1992 | Page .................................... 356/350 |
| 5,181,078 | 1/1993 | Lefevre et al. ..................... 356/350 |
| 5,270,791 | 12/1993 | Lefevre et al. ..................... 356/350 |
| 5,297,436 | 3/1994 | Chan et al. ............................ 73/657 |
| 5,400,418 | 3/1995 | Pearson et al. ....................... 385/11 |
| 5,434,501 | 7/1995 | Esman et al. ................... 250/227.17 |
| 5,455,676 | 10/1995 | Nishiura et al. .................... 356/350 |
| 5,463,312 | 10/1995 | Lutz et al. ............................. 324/96 |
| 5,479,094 | 12/1995 | Esman et al. ......................... 324/96 |
| 5,553,173 | * 9/1996 | Lutz et al. ............................ 385/12 |
| 5,587,791 | * 12/1996 | Belleville et al. ................ 385/12 X |
| 5,598,489 | 1/1997 | Pavlath et al. ........................ 385/12 |
| 5,644,397 | 7/1997 | Blake ................................. 356/345 |
| 5,677,622 | 10/1997 | Clarke .................................. 324/96 |
| 5,696,858 | 12/1997 | Blake ................................... 385/12 |
| 5,729,005 | * 3/1998 | MacDougall et al. ............ 385/12 X |
| 5,732,167 | * 3/1998 | Ishiko et al. .......................... 385/12 |
| 5,780,847 | * 7/1998 | Dawson et al. .................. 385/12 X |
| 5,978,084 | 11/1999 | Blake ................................. 356/350 |
| 5,987,195 | * 11/1999 | Blake ................................... 385/12 |
| 5,999,668 | * 12/1999 | Hernandez et al. .................. 385/12 |
| 6,023,331 | 2/2000 | Blake et al. ......................... 356/345 |

OTHER PUBLICATIONS

J. Blake, P. Tantaswadi and R. T. de Carvalho; "In Line Sagnac Interferometer Current Sensor," 1995 IEEE Transactions on Power Delivery, vol. 11, No. 1, Jan. 1996.

Tong Yu et al., "Magnet–sensitive Optical Fiber and its Application in Current Sensor System," Database accession No. 4250392 XP002131302 abstract & Fiber Optic and Laser Sensors IX, Bottom, MA, USA, 3–5 Sep. 1991, vol. 1584, pp. 135–137, Proceedings of the SPIE –The International Society for Optical Engineering, 1991, US ISSN: 0277–786X.

R. T. de Carvalho, J. Blake, and G. Sanders, "Sagnac Interferometers for Accurate Measurements of True Nonreciprocal Effects", SPIE, vol. 2070, pp. 264–269, (Sep. 1993).

Kent B. Rochford, Gordon W. Day, and Peter R. Forman, "Polarization Dependence of Response Functions in 3x3 Sagnac Optical Fiber Current Sensors", Journal of Lightwave Technology, vol. 12, No. 8, Aug. 1994, pp. 1504–1509.

P. A. Nicati and Ph. Robert, "Stabilised Current Sensor Using Sagnac Interferometer", IOP Publishing Ltd., 1988 pp. 791–796, (1988).

H. Taylor, "Fiber Sensors: 2", U.S. Naval Research Laboratory, Apr. 29, 1981, pp. 128–130.

P. A. Nicati and Ph. Robert, "Stabilized Sagnac Optical Fiber Current Sensor Using One Phase and Two Amplitude Modulations", Swiss Federal Institute of Technology of Lausanne, pp. 402–405, (1992).

I. G. Clarke, D. Geake, I. M. Bassett, S. B. Poole, and A. D. Stokes, "A Current Sensor Using Spun Birefringent Fibre in a Sagnac Configuration", OFTC, University of Sydney, Australia, pp. 167–170, (1993).

A. Yu and A. S. Siddiqui, "A Theoretical and Experimental Investigation of a Practicable Fibre Optic Current Sensor Using Sagnac Interferometer", Department of Electronic Systems Engineering, University of Essex, pp. 289–292, (1993).

L. R. Veeser and G. W. Day, "Faraday Effect Current Sensing Using a Sagnac Interferometer With a 3x3 Coupler", National Institute of Standards and Technology, pp. 325–328, (1990).

P. Akhavan Leilabady, A. P. Wayte, M. Berwick, J. D. C. Jones, and D. A. Jackson, "A Pseudo–Reciprocal Fibre–Optic Faraday Rotation Sensor: Current Measurement and Data Communication Applications", Elsevier Science Publishers B. V., pp. 173–176. vol. 59, No. 3, Sep. 1986.

R. A. Bergh, H. C. Lefevre, and H. J. Shaw, "Geometrical Fiber Configuration for Isolators and Magnetometers", Fiber–Optic Rotation Sensors and Related Technologies, Springer Series in Optical Sciences 32, 1982, pp. 111–116.

R. T. de Carvalho and J. Blake, "Simultaneous Measurement of Electric and Magnetic Fields Using a Sagnac Interferometer", Texas A&M University, College Station, Texas, (Sep. 1994).

S. X. Short, et al., "Imperfect quarter–waveplate compensation in Sagnac Interferometer type current sensors," Journal of Lightwave Technology, Conference Proceedings, Oct. 27, 1997.

J. R. Qian, Q. Guo, and L. Li, "Spun Linear Birefringence Fibres and Their Sensing Mechanism in Current Sensors with Temperature Compensation," IEE Proceedings Optoelectronics 141 (1994) Dec., No. 6, pp. 373–380, Stevenage, Herts., GB.

I. M. Bassett, "Design Principle for a Circularly Birefringent Optical Fiber," Optics Letters, vol. 13, No. 10, Oct. 1988, pp. 844–846.

Ian G. Clarke, "Temperature–Stable Spun Elliptical–Core Optical–Fiber Current Transducer," Optics Letters, vol. 18, No. 2, Jan. 15, 1993, pp. 158–160.

Richard I. Laming and David N. Payne, "Electric Current Sensors Employing Spun Highly Birefringent Optical Fibers," Journal of LIghtwave Technology, vol. 7, No. 12, Dec. 1989, pp. 2084–2094.

Osamu Kamada, Yoshinobu Tsujimoto and Yoshiaka Hayashi, "Fiber–Optical Current Sensors Using Mixed Rare–Earth Iron Garnet Cystals," Proceedings of the $3^{rd}$ Sensor Symposium, 1983, pp. 167–169.

F. Maystre and A. Bertholds, "Magneto–optic Current Sensor Using a Helical Fiber Fabry–Perot Resonator," Springer Proceedings in Physics, vol. 44, pp. 267–272, (1989).

J. N. Ross, "The Rotation of the Polarization in Low Birefringence Monomode Optical Fibres Due to Geometric Effects," Optical and Quantum Electronics 16 (1984), pp. 455–461.

Guido Frosio and Rene Dandliker, "Reciprocal Reflection Interferometer for a Fiber–Optic Faraday Current Sensor," Applied Optics, Sep. 1, 1994, vol. 33, No. 25, pp. 6111–6122.

Oho, Shigeru, Hisao Sonobe and Hiroshi Kajioka, "Time––Domain Sagnac Phase Reading in Open–Loop Fiber Optic Gyroscopes," IEICE Trans Electron, vol. E79 C. No. 11, pp. 1596–1601, (Nov. 1996).

Deeter, Merritt N., "Fiber–optic Faraday–effect Magnetic–field Sensor Based on Flux Concentrators," Applied Optics, vol. 35, No. 1 Jan. 1, 1996.

* cited by examiner

FIBER OPTIC CURRENT SENSOR

BACKGROUND

The present invention pertains to fiber optic sensors and, particularly, to fiber optic current sensors.

Fiber optic current sensors work in the principle of the Faraday effect. Current flowing in a wire induces a magnetic field, which, through the Faraday effect rotates the plane of polarization of the light traveling in the optical fiber wound around the current carrying wire. Faraday's law, stated as $$I = \oint H dL$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\phi$, through which the plane of polarization of light rotates in the presence of a magnetic field is given by $$\Delta\phi = \int H \cdot dL$$

where V is the Verdet constant of the fiber glass. The sensing optical fiber performs the line integral of the magnetic field along its path, which is proportional to the current in the wire, when that path closes on itself. Thus, one has $\Delta\phi = VNI$ where N is the number of turns of sensing fiber wound around the current carrying wire. The rotation of the state of polarization of the light due to the presence of an electrical current is measured by injecting light with a well-defined linear polarization state into the sensing region, and then analyzing the polarization state of the light after it exits the sensing region. Alternatively, $\Delta\phi$ represents the excess phase shift encountered by a circularly polarized light wave propagating in the sensing fiber.

This technology is related to the in-line optical fiber current sensor as disclosed in U.S. Pat. No. 5,644,397 issued Jul. 1, 1997, to inventor James N. Blake and entitled "Fiber Optic Interferometric Circuit and Magnetic Field Sensor", which is incorporated herein by reference. Optical fiber sensors are also disclosed in U.S. Pat. No. 5,696,858 issued Dec. 9, 1997, to inventor James N. Blake and entitled, "Fiber Optics Apparatus and Method for Accurate Current Sensing", which is incorporated herein by reference.

The in-line and Sagnac type current sensors disclosed in U.S. Pat. No. 5,644,397, cited above may be operated in a closed loop fashion using direct digitization of the output of the preamplifier attached to the photodetector. The closed loop waveform may incorporate a number of different techniques, well known in the art of fiber optic gyroscopes, including dual ramp, serrodyne, and digital phase ramp. These closed loop techniques, when applied to the in-line and Sagnac type current sensor improve the sensitivity and accuracy of the sensor over that obtainable using the simpler open loop demodulation techniques.

A loop closure scheme typically involves digitization of the output of a preamplifier attached to the photodetector output signal from an analog voltage to a digital one, via an analog-to-digital (A/D) converter in loop closure electronics. An A/D converter "samples"" or converts the preamplifier output to a digital signal representative of the preamp signal periodically, typically several times per half modulation cycle of the bias modulation period of the signal from a bias modulation signal generator. The output of the A/D converter is compared between the two half cycles with a signal indicative of current changes. The presence of a current change changes a loop closure waveform signal is applied to a phase modulator via a digital-to-analog (D/A) converter. The loop closure waveform signal used to rebalance the phase (phi) between the counterpropagating optical waves in the sensing loop may be a sawtooth-type signal (a so-called serrodyne ramp), a digital phase step waveform or a dual ramp waveform. All of these are applied asymmetrically to the interferometer loop to take advantage of the time delay in coil and allow a phase difference (equal and opposite to that generated by current) between the waves, to be generated. The sawtooth or serrodyne waveform has a gradual phase slope proportional to the electric current magnitude with a rapid flyback or reset of a multiple of $2\pi$ phase shift in size. The dual ramp waveform alternates between a positive-going phase ramp and a negative-going one with the difference in the magnitude of the up-slope and the down-slope being proportional to the electric current, all ramp types are capable of reversing to indicate a reversal in the direction of the current in the conductor.

However, a need has arisen for a fiber optic current sensor with much improved sensitivity. Certain applications require that small leakage currents be detected in systems carrying large nominal currents. Examples of such applications include detecting leakage currents in underground distribution cables and in battery charging systems. In charging systems, the detection of leakage currents can be used to provide protection against electrocution of the operator. Also, the current sensor may be part of a ground-fault interrupter.

SUMMARY OF THE INVENTION

The present invention discloses several methods of increasing the sensitivity of the in-line and Sagnac loop type current sensors.

In a first aspect of the invention, an optimally spun birefringent fiber is disclosed. This allows a circular state of polarization to be well maintained throughout a long length of bent fiber so that the number of turns of sensing fiber around the current carrying wire can be increased to a large number.

In a second aspect of the invention, a dopant such as Terbium is added to the optical fiber of the coil to increase the Verdet constant of the sensing fiber, which in turn increases the magnetic sensitivity of the coil. This is advantageously done in combination with using the optimally spun fiber.

In a third aspect of the invention, a Faraday rotator is used to passively bias the sensor, and the system is run closed loop using a phase nulling current passing through the sensing coil (in addition to the current to be measured which also passes through the sensing coil). This is also advantageously done in combination with either one or both of the first and second aspects of this invention.

DESCRIPTION OF THE EMBODIMENT

Figure 1A:
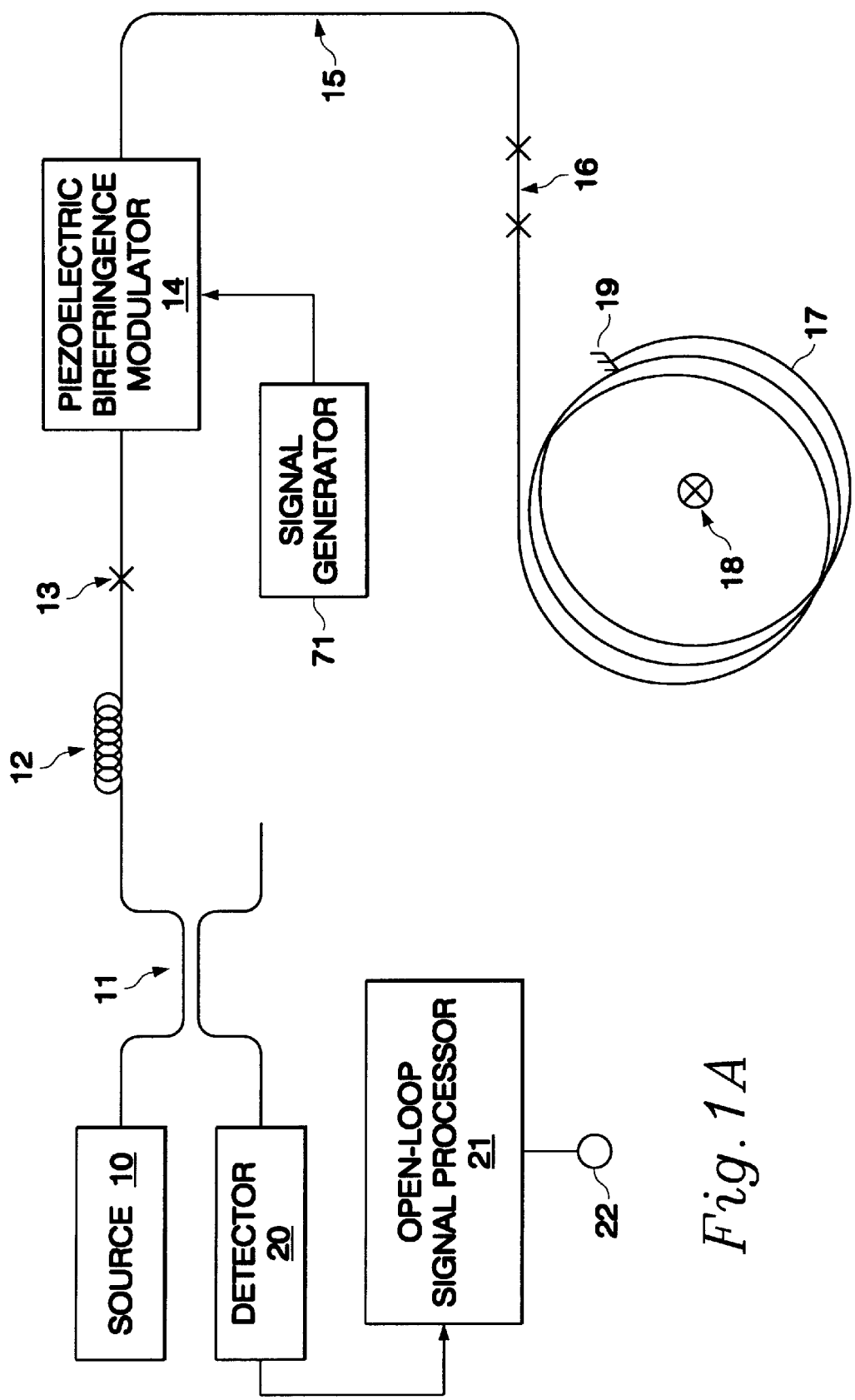
FIG. 1a shows an in-line current sensor utilizing a piezoelectric birefringence modulator and open-loop signal processing together with an optimized sensing fiber.

FIG. 1a shows an embodiment of an in-line current sensor. Light from source 10 propagates through coupler 11 and polarizer 12 to a 45-degree splice 13, where it divides equally into the two polarization states maintained throughout the rest of the optical circuit. Piezoelectric birefringence modulator 14 differentially modulates the phases of the light in the two polarization states. Modulator 14 is driven by a modulator signal generator 71 that provides an electrical, periodic, alternating signal having either a square or sine wave. The light then propagates through delay line 15, through mode converter 16 which converts the two linear states of polarization into two circular states of polarization, and through optimized sensor coil 17. Optimized sensor coil 17 is wound around current carrying wire 18. The light reflects off reflective termination 19 and retraces its way through the optical circuit, finally arriving at detector 20. Open-loop signal processor 21 converts the detected signal to an output 22 which is indicative of the current flowing in current carrying wire 18.

The sensor achieves its greatest sensitivity when the circular states of polarization are well maintained throughout the sensing coil. It is well known in the art that a spun birefringent fiber can preserve a circular state of polarization to some degree. However, for this invention, the concern is that the circular state of polarization be extraordinarily well maintained so that a very long length (hundreds of meters) of sensing fiber can be used. A straight spun birefringent fiber does hold a circular state of polarization over a long distance, but achieving this property is much more difficult when the fiber is bent, as is done when it is wrapped around a current carrying wire.

Figure 2:
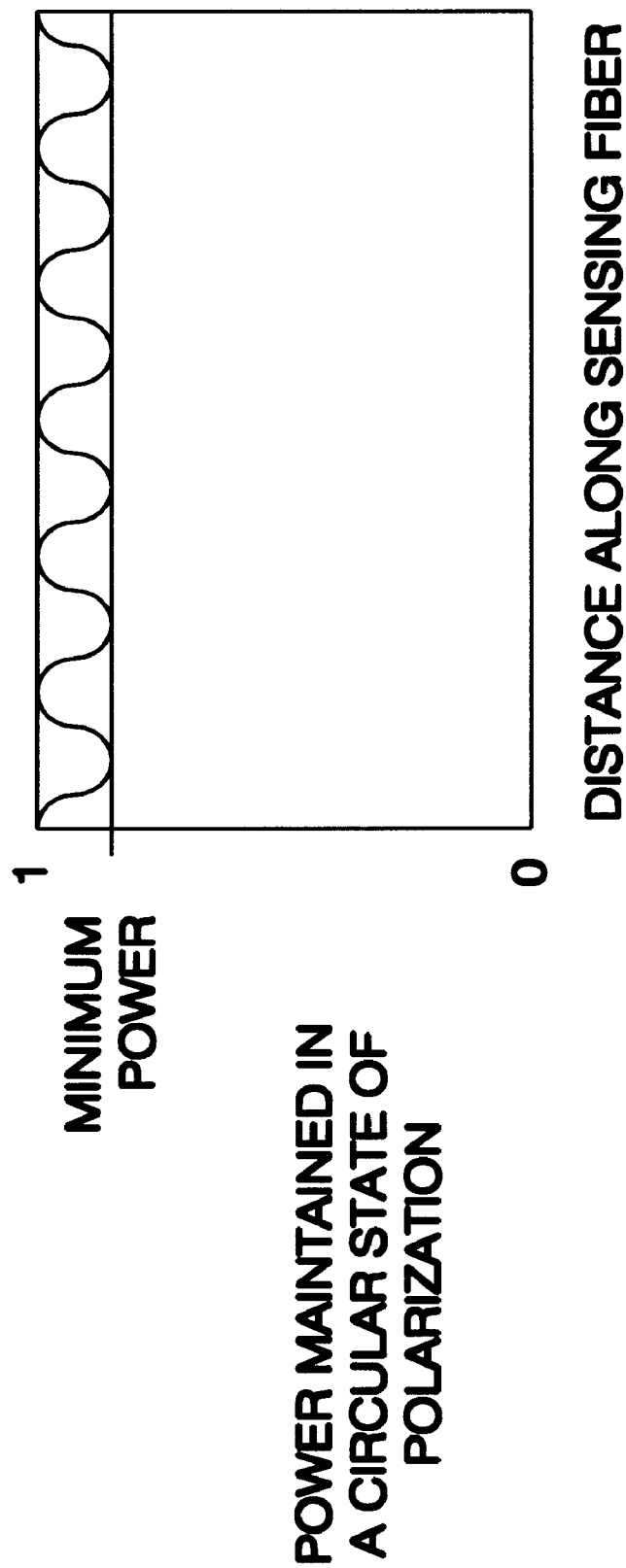
FIG. 2 shows the remaining power present in a circular state of polarization as the light propagates along a bent spun birefringent fiber.

FIG. 2 illustrates the circular polarization holding capability of a bent spun birefringent fiber. As the light propagates down the fiber, the light oscillates in and out of the pure circular polarization state. For minimizing the power that leaves the desired circular state of polarization, it is important to optimize the ratio of the spin rate to the intrinsic polarization beat length of the fiber. If the spin rate is too fast, the intrinsic birefringence of the fiber is too well averaged and the fiber becomes very sensitive to bend induced birefringence. If the spin rate is too slow, the intrinsic birefringence is not well averaged, and the fiber does not hold a circular state of polarization for this reason. Numerical modeling of the characteristics of a bent spun birefringent fiber yields the result that for practical bend radii (2 to 10 cm) the optimum ratio of the spin rate to the intrinsic beat length is between 4 and 6. Minimum degradation of the circular polarization holding capability is achieved when the ratio is between 3 and 8. By choosing a fiber with a spin rate in this range, the circular polarization state of the fiber can be maintained for a long length of fiber allowing for the sensitivity of the sensor to be greatly increased.

A second method of increasing the sensitivity of the sensor of FIGS. 1, and 3–7 is to dope the fiber with a material that increases the fiber's Verdet constant. Terbium is one element that has this desired effect. Doping the fiber can be done in conjunction with optimally spinning the fiber. The optimized sensor coil 17 of FIG. 1a is advantageously both optimally spun and doped.

Figure 1B:
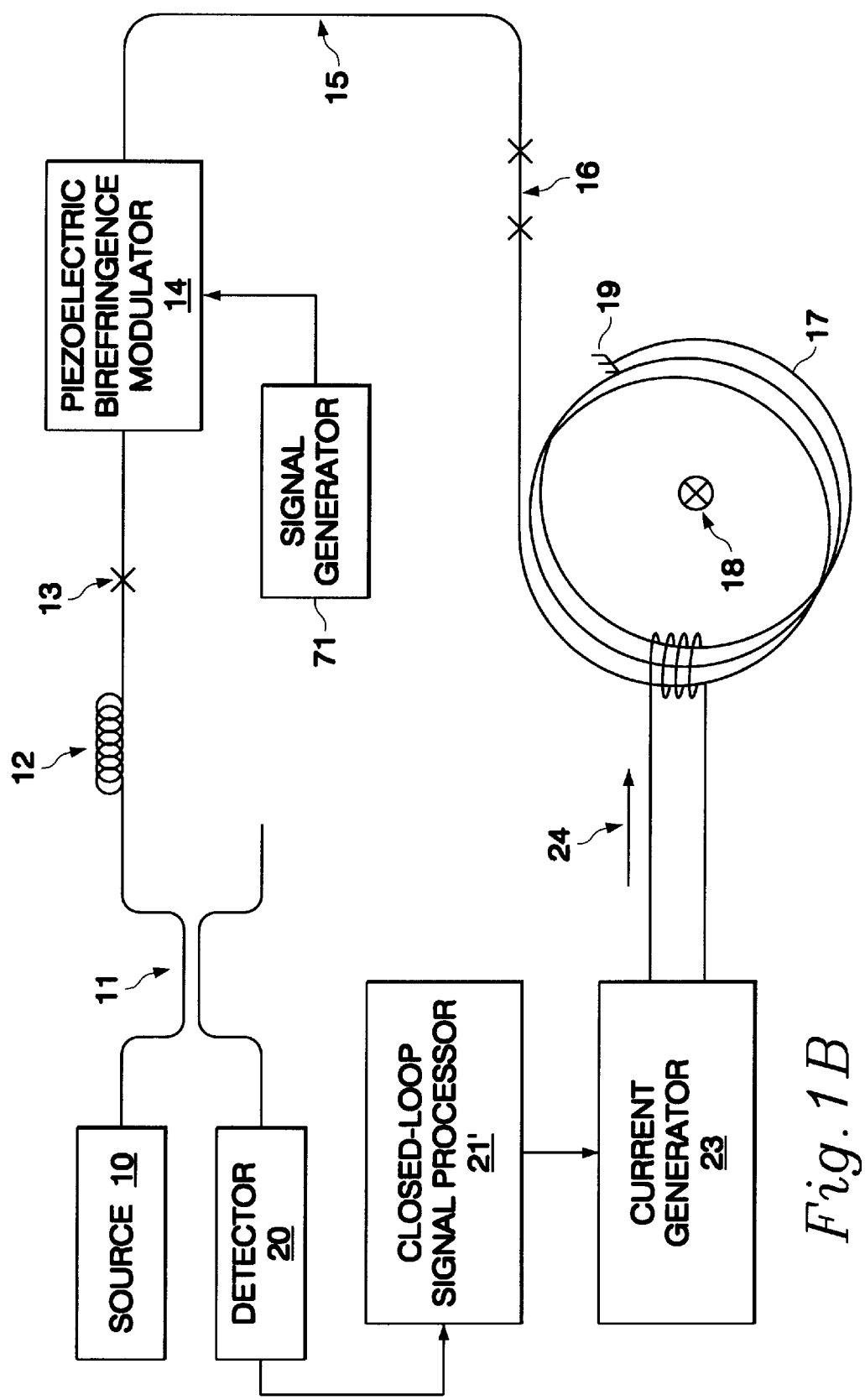
FIG. 1b shows an in-line current sensor utilizing a piezoelectric birefringence modulator and a phase nulling current based closed loop signal processing together with an optimized sensing fiber.

FIG. 1b shows a variation of the sensor disclosed in FIG. 1a. In this configuration, a closed loop signal processor 21' drives a current generator 23 that produces a phase nulling current 24. Phase nulling current 24 passes through the optimized sensor coil 17 producing a substantially equal and opposite effect to that produced by the current in current carrying wire 18. With this method of operation, the non-reciprocal phaseshift induced in the current sensor is kept very small, allowing for a very high sensitivity sensing coil to be employed without encountering non-linearities associated with detecting large phase shifts.

Figure 3A:
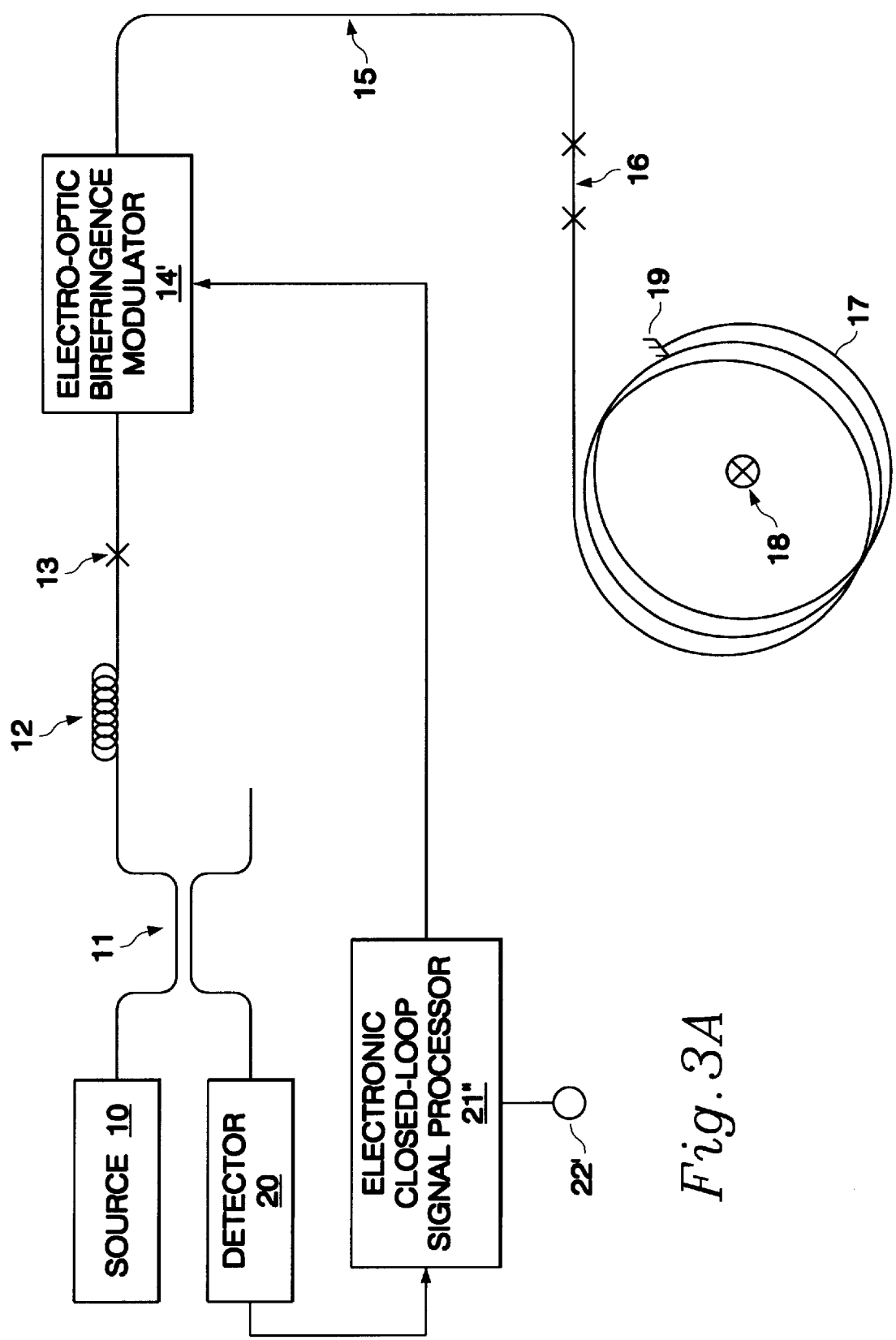
FIG. 3a shows an in-line current sensor utilizing an electrooptic birefringence modulator and electronic closed loop signal processing together with an optimized sensing fiber.
Figure 3B:
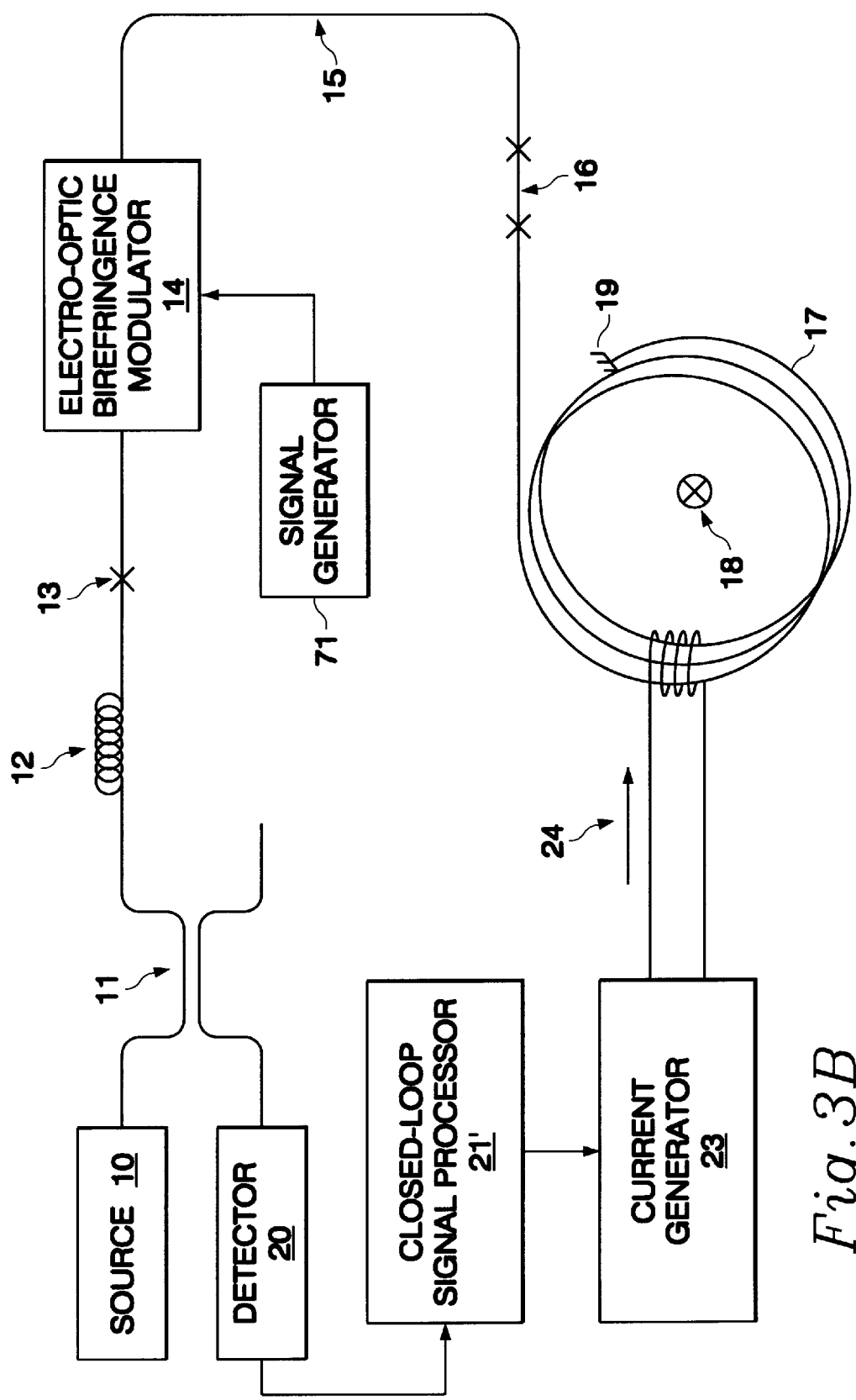
FIG. 3b shows an in-line current sensor utilizing an electrooptic birefringence modulator and a phase nulling current based closed loop signal processing together with an optimized sensing fiber.

FIGS. 3a and 3b show in-line current sensors similar to those in FIGS. 1a and 1b, the difference being that the piezoelectric birefringence modulators are replaced with electrooptic modulators 14'. FIG. 3a shows a configuration where an electronic closed loop signal processor 21" is used to provide a feedback signal to 14'. Also, the closed-loop processors connected to the modulators in this disclosure provide bias signals like that of generator 71, as note above. Electronic closed loop signal processor 21" may provide a dual-ramp, serrodyne, or digital phase step closed loop signal. FIG. 3b show a configuration similar to FIG. 1b, where current is used to close the loop.

Figure 4:
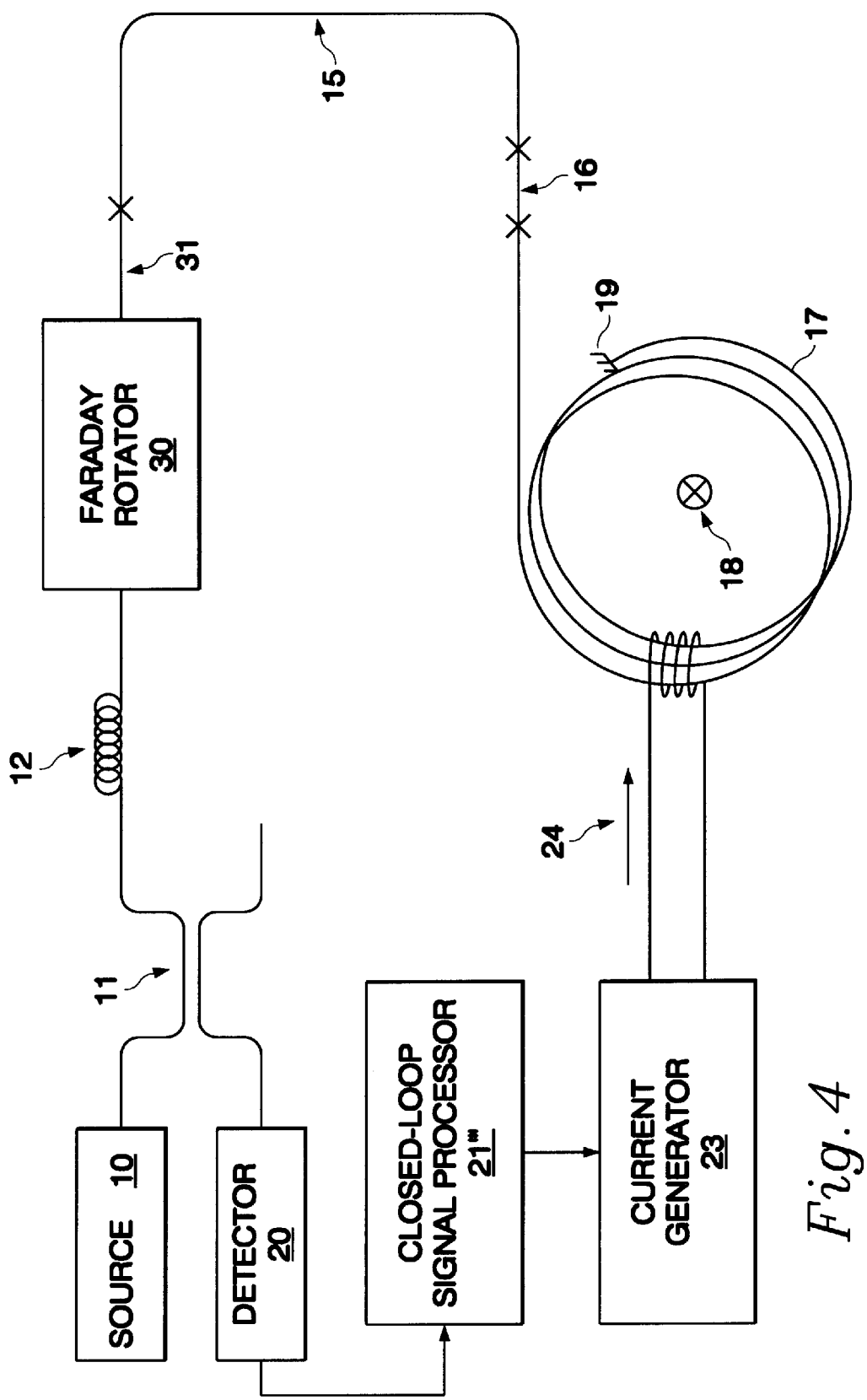
FIG. 4 shows a Faraday rotator based passive in-line current sensor and a phase nulling current based closed loop signal processing together with an optimized sensing fiber.

FIG. 4 shows a passive version of the current sensor, where Faraday rotator 30 and mode converter 31 provide a passive bias to the sensor. Mode converter 31 is a quarter waveplate. The polarization rotation provided by Faraday rotator 30 is 22.5 degrees. The bias phase shift to the interference pattern is four tines the rotation provided by the Faraday rotator. The phase nulling current 24 from current generator 23, which is controlled by closed-loop signal processor 21''', in this configuration can be more accurate for high frequencies that are achievable for the modulated architectures of FIGS. 1 and 3, as the bandwidth of the passive sensor is much greater.

Figure 5A:
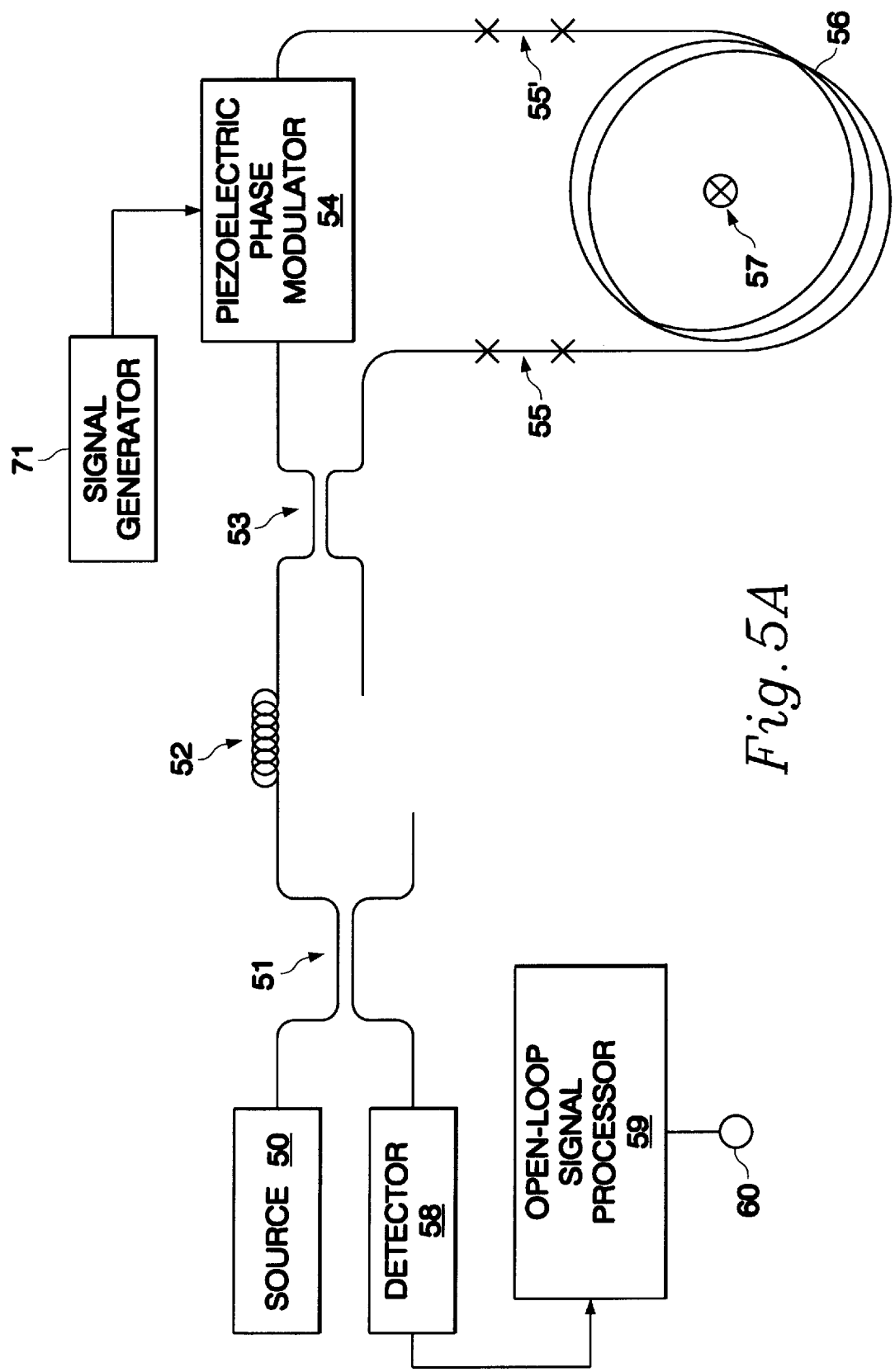
FIG. 5a shows a Sagnac type current sensor utilizing a piezoelectric phase modulator and open-loop signal processing together with an optimized sensing fiber.

FIG. 5a shows a Sagnac loop current sensor. Light from source 50 propagates through coupler 51 and polarizer 52 to loop coupler 53 where it is split and sent in two directions around the fiber loop. Piezoelectric phase modulator 54 provides a dynamic phase bias. Modulators 54 and 70 of the presently disclosed Sagnac sensors modulate the phase difference of the counter-propagating waves of a polarization state. The signal driving these modulators is a signal like that of generator 71. Mode converters 55 and 55' convert the light to a circular state of polarization for passage through optimized sensor coil 56. The optimization condition for the bent spun fiber is the same for the Sagnac loop current sensor as for the in-line sensor. Minimum deviation of the state of polarization of the light from the circular is achieved when the ratio of the spin rate to the intrinsic polarization beat length is between 3 and 8. When this condition is achieved, a very large number of turns of sensing fiber can be wrapped around current carrying wire 57. The light returns through the optical circuit to detector 58. Open loop signal processor 59 demodulates the signal to give an output 60 that is indicative of the current flowing in current carrying wire 57.

Figure 5B:
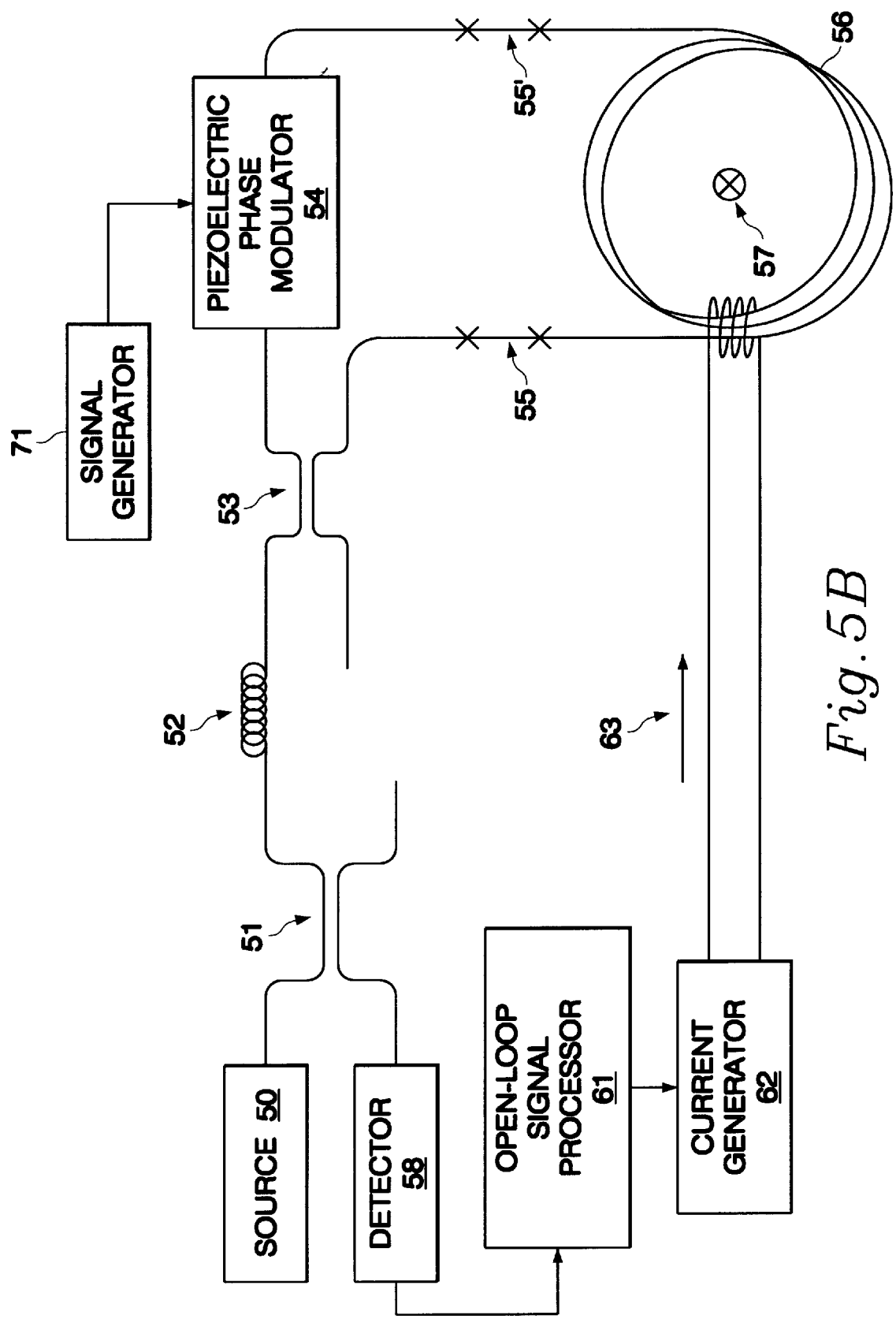
FIG. 5b shows a Sagnac type current sensor utilizing a piezoelectric phase modulator and a phase nulling current based closed loop signal processing together with an optimized sensing fiber.

FIG. 5b shows a variation of FIG. 5a, where the signal processing is now accomplished by closed loop signal processor 61 which drives a current generator 62 which in turn produces phase nulling current 63. Phase nulling current 63 substantially cancels the non-reciprocal phase shift produced by the current in current carrying wire 57, allowing for a very high sensitivity sensing coil to be employed.

Figure 6A:
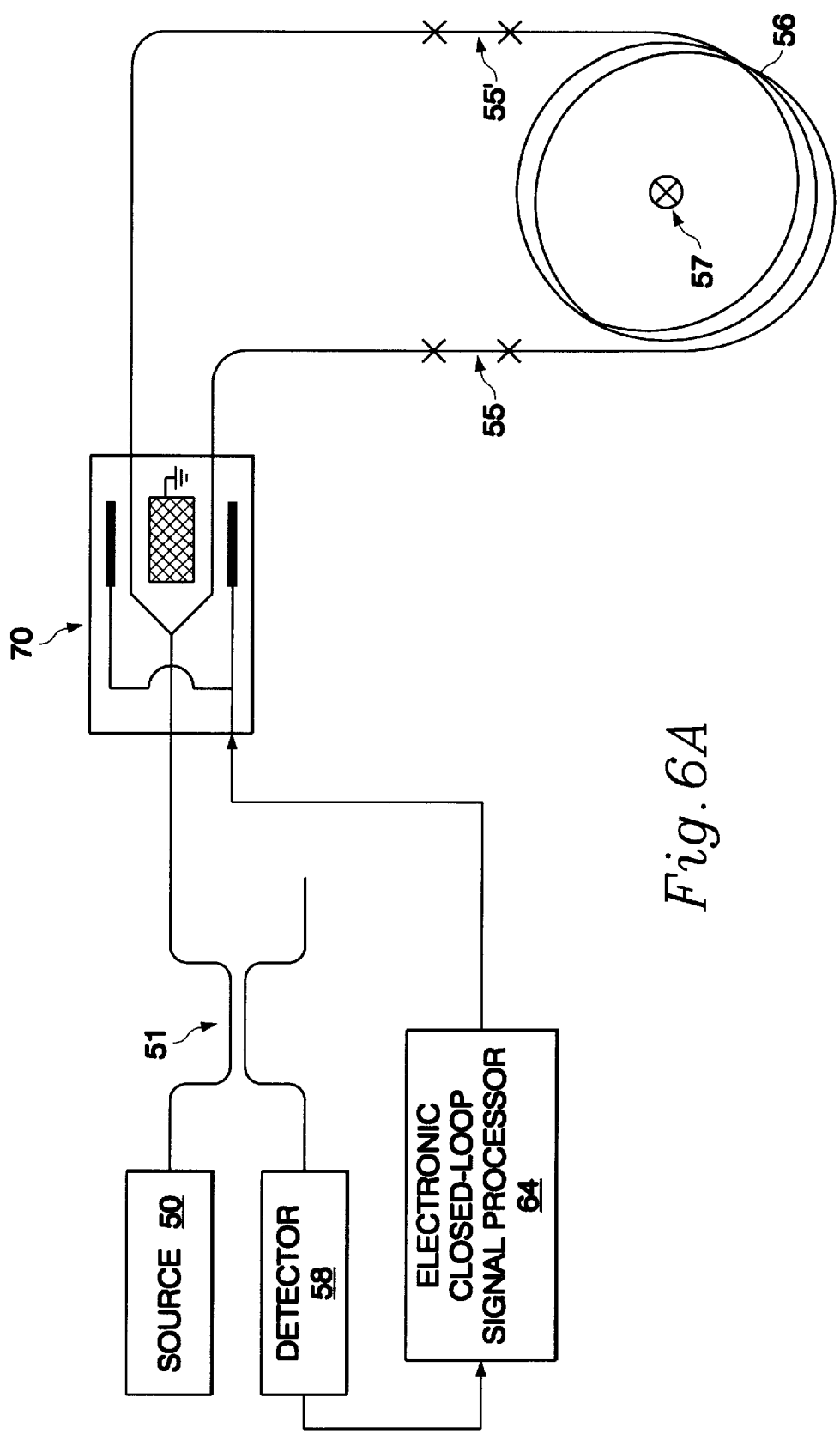
FIG. 6a shows a Sagnac type current sensor utilizing an electrooptic phase modulator and electronic closed loop signal processing together with an optimized sensing fiber.
Figure 6B:
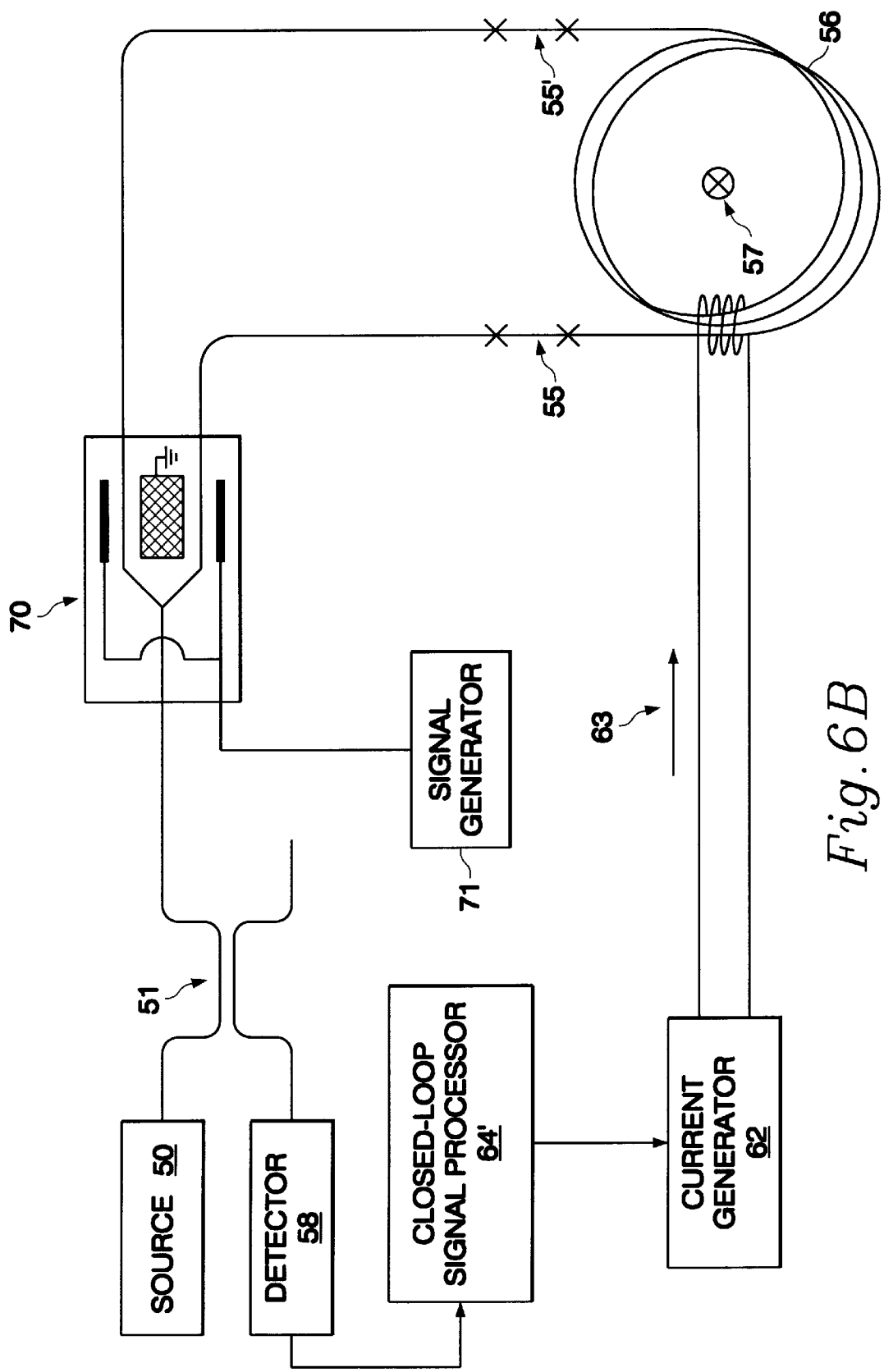
FIG. 6b shows a Sagnac type current sensor utilizing an electrooptic phase modulator and a phase nulling current based closed loop signal processing together with an optimized sensing fiber.

FIG. 6a shows another version of the Sagnac loop current sensor where the polarization, loop splitter, and phase modulation functions have been combined into a single integrated optics multifunction chip 70. Electronic closed loop signal processor 64 provides an electronic closed loop signal to the phase modulator. This signal may be dual ramp, serrodyne or digital phase step. FIG. 6b shows a version of the current sensor where the signal processing is accomplished by closed loop signal processor 64' which drives current generator 62 which in turn provides phase nulling current 63.

Figure 7:
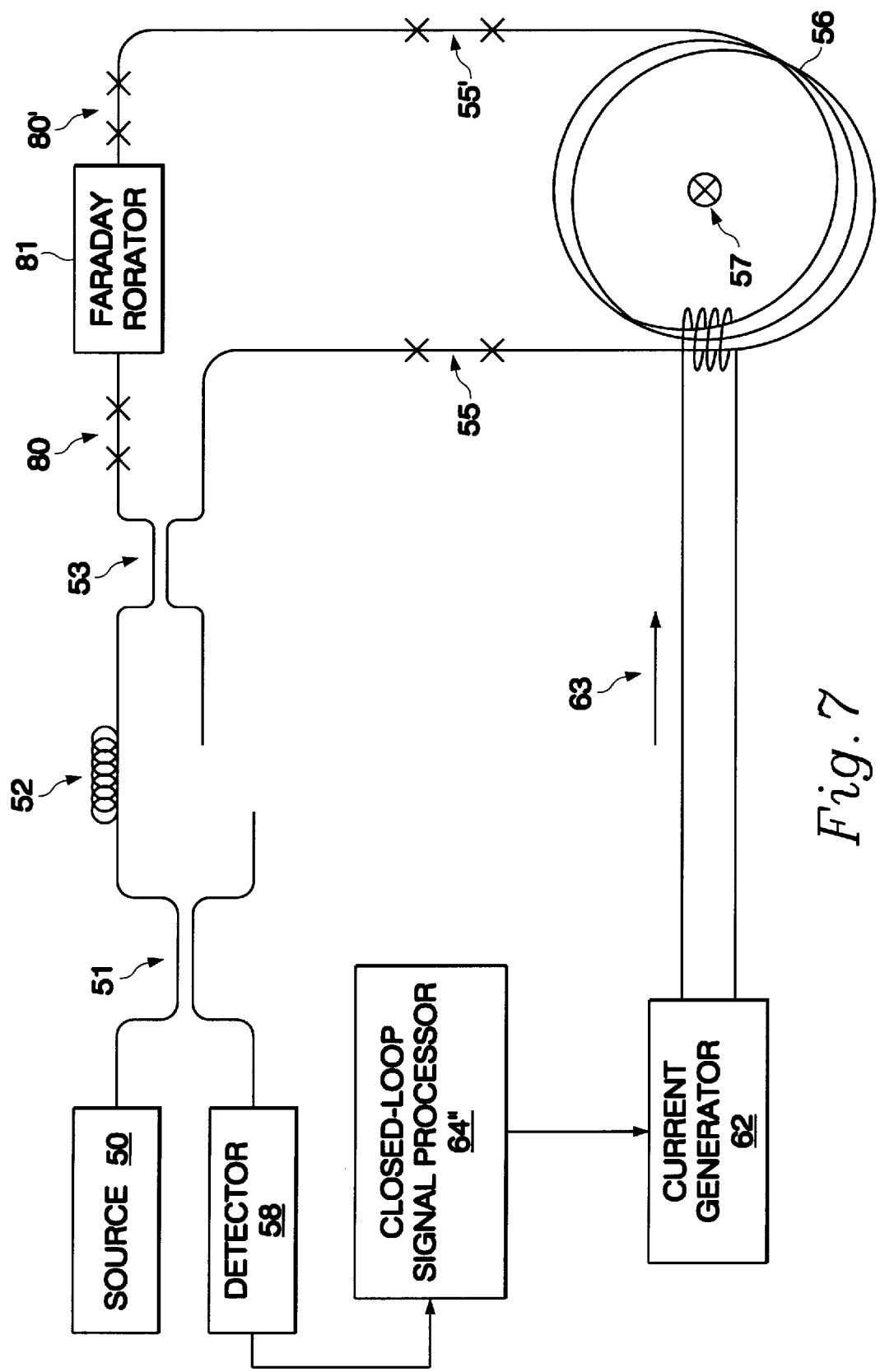
FIG. 7 shows a Faraday rotator based passive Sagnac type current sensor and a phase nulling current based closed loop signal processing together with an optimized sensing fiber.

FIG. 7 shows a Sagnac loop current sensor where the phase bias is provided passively by Faraday rotator 81 surrounded by mode converters 80 and 80'. Mode converters 80 and 80' are advantageously quarter waveplates so that they convert linear polarization to circular polarization. For this passive sensor, the loop closure bandwidth of phase nulling current 63 (from generator 62 that is controlled by processor 64") can be much greater than in the dynamically biased versions of the sensor. This allows for greater measurement accuracy at higher frequencies.

There are other variants and embodiments, which encompass the present invention.

What is claimed is:

1. A fiber optic current sensor comprising:
   a light source;
   a polarizer coupled to said light source;
   a first polarization converter coupled to said polarizer;
   a sensing fiber coil connected to said polarization converter, wherein fiber of said sensing fiber coil is spun with a spin rate for a predetermined maintenance of circular polarization;
   a terminating reflector connected to said sensing fiber; and
   a detector coupled to said polarizer.

2. the sensor of claim 1, wherein the spin rate is between 3 and 8 complete revolutions per polarization beat length of said sensing fiber.

3. The sensor of claim 2, further comprising a Faraday rotator placed between said polarizer and said first polarization converter.

4. The sensor of claim 3, further comprising a second polarization converter placed between said Faraday rotator and said first polarization converter.

5. The sensor of claim 4, wherein the first and second polarization converters comprise quarter waveplates.

6. The sensor of claim 3, further comprising a means for generating a secondary current that flows through said sensing fiber coil substantially nulling the output of said sensor.

7. The sensor of claim 1, further comprising a piezoelectric birefringence modulator placed between said polarizer and said polarization converter.

8. The sensor of claim 7, wherein said polarization converter comprises a quarter waveplate.

9. The sensor of claim 7, further comprising a means for generating a secondary current that flows through said sensing fiber coil substantially nulling the output of said sensor.

10. The sensor of claim 1, further comprising an electrooptic birefringence modulator placed between said polarizer and said polarization converter.

11. The sensor of claim 10, wherein said polarization converter comprises a quarter waveplate.

12. The sensor of claim 10, further comprising a means for generating a secondary current that flows through said sensing fiber coil substantially nulling the output of said sensor.

13. The sensor of claim 1, wherein the fiber of said sensing fiber coil has a doping element that increases the Verdet constant of the sensing fiber.

14. The sensor of claim 13, wherein the doping element is Terbium.

15. The sensor of claim 13, further comprising a Faraday rotator placed between said polarizer and said polarization converter.

16. The sensor of claim 15, further comprising a second polarization converter placed between said Faraday rotator and said polarization converter.

17. The sensor of claim 16, wherein the said polarization converters comprise quarter waveplates.

18. The sensor of claim 13, further comprising a means for generating a secondary current that flows through said sensing fiber coil substantially nulling the output of said sensor.

19. The sensor of claim 1 further comprising a piezoelectric birefringence modulator placed between said polarizer and said polarization converter.

20. The sensor of claim 19, wherein said polarization converter comprises a quarter waveplate.

21. The sensor of claim 19, further comprising a means for generating a secondary current that flows through said sensing fiber coil substantially nulling the output of said sensor.

22. The sensor of claim 13, further comprising an electrooptic birefringence modulator placed between said polarizer and said polarization converter.

23. The sensor of claim 22, wherein said polarization converter comprises a quarter waveplate.

24. The sensor of claim 22, further comprising a means for generating a secondary current that flows through said sensing fiber coil substantially nulling the output of said sensor.

25. A fiber optic current sensor comprising
   a light source;
   a polarizer coupled to said light source;
   an optical splitter connected to said polarizer;
   a fiber loop connected at each end to said optical splitter;
   a sensing fiber coil, situated within said fiber loop and having sensing fiber, wherein the sensing fiber of said sensing fiber coil is spun and contains linear birefringence, and has a spin rate for a predetermined maintenance of circular polarization; and a detector coupled to said polarizer and having an output.

26. The sensor of claim 25, wherein the spin rate is between 3 and 8 revolutions per polarization beat length of the sensing fiber.

27. The sensor of claim 26, further comprising a Faraday rotator situated within said fiber loop.

28. The sensor of claim 27, further comprising a means for generating a secondary current that flows about said sensing fiber coil substantially nulling the output of said detector.

29. The sensor of claim 25, further comprising a piezoelectric phase modulator situated within said fiber loop.

30. The sensor of claim 29, further comprising a means for generating a secondary current that flows about said sensing fiber coil substantially nulling the output of said detector.

31. The sensor of claim 25, further comprising an electrooptic phase modulator situated within said fiber loop.

32. The sensor of claim 31, further comprising a means for generating a secondary current that flows about said sensing fiber coil substantially nulling the output of said detector.

33. The sensor of claim 25, wherein the sensing fiber of said sensing fiber coil contains a doping element that increases the Verdet constant of the fiber.

34. The sensor of claim 33, wherein the doping element is Terbium.

35. The sensor of claim 33, further comprising a Faraday rotator situated within said fiber loop.

36. The sensor of claim 35, further comprising a means for generating a secondary current that flows about said sensing fiber coil substantially nulling the output of said detector.

37. The sensor of claim 33, further comprising a piezoelectric phase modulator situated within said sensing fiber loop.

38. The sensor of claim 37, further comprising a means for generating a secondary current that flows about said sensing fiber coil substantially nulling the output of said detector.

39. The sensor of claim 33, further comprising an electrooptic phase modulator situated within said fiber loop.

40. The sensor of claim 39, further comprising a means for generating a secondary current that flows about said sensing fiber coil substantially nulling the output of said detector.

41. A fiber optic current sensor comprising:

a light source;

a polarizer coupled to said light source;

a Faraday rotator coupled to said polarizer;

a first quarter waveplate coupled to said Faraday rotator;

a polarization maintaining fiber coupled to said first quarter waveplate;

a second quarter waveplate coupled to said polarization maintaining fiber; and a sensing fiber, that substantially preserves circular states of polarization, coupled to said second quarter waveplate;

a reflective termination coupled to said sensing fiber; and a photodetector coupled to said polarizer and having an output.

42. The sensor of claim 41 wherein said sensing fiber forms a sensing coil around a current conducting wire.

43. The sensor of claim 42, further comprising a means for generating a secondary current that flows about said sensing coil that substantially nulls the output of said photodetector.

* * * * *